United States Patent

Hagura

[11] Patent Number: 6,140,862
[45] Date of Patent: Oct. 31, 2000

[54] SEMICONDUCTOR CIRCUIT DEVICE HAVING INTERNAL POWER SUPPLY CIRCUIT

[75] Inventor: Tsukasa Hagura, Hyogo, Japan

[73] Assignee: Mitsubishi Denki Kabushiki Kaisha, Tokyo, Japan

[21] Appl. No.: 09/129,387

[22] Filed: Aug. 5, 1998

[30] Foreign Application Priority Data

Feb. 16, 1998 [JP] Japan .................................. 10-032748

[51] Int. Cl.[7] ...................................................... G05F 3/02
[52] U.S. Cl. .......................... 327/537; 327/308; 327/525
[58] Field of Search .................................. 327/308, 525, 327/530, 534, 535, 537, 538, 539, 540, 541, 542, 543, 545, 546

[56] References Cited

U.S. PATENT DOCUMENTS

| 4,100,437 | 7/1978 | Hoff, Jr. ................................... 307/297 |
| 4,994,688 | 2/1991 | Horiguchi et al. .................... 307/296.8 |
| 5,867,055 | 2/1999 | Asaumi et al. .......................... 327/525 |
| 5,929,691 | 7/1999 | Kim et al. ................................ 327/525 |

FOREIGN PATENT DOCUMENTS

| 59-58858 | 4/1984 | Japan . |
| 59-121854 | 7/1984 | Japan . |
| 6-324753 | 11/1994 | Japan . |
| 8-316327 | 11/1996 | Japan . |

*Primary Examiner*—Jeffrey Zweizig
*Attorney, Agent, or Firm*—McDermott, Will & Emery

[57] ABSTRACT

A semiconductor integrated circuit has an internal power supply circuit which includes a differential amplifier, a driver transistor having its gate connected to an output terminal of the differential amplifier and is connected between an external power supply node and an internal power supply node, four transistors connected in parallel between the internal power supply node and a non-inversion input terminal of the differential amplifier, a first control circuit provided corresponding to two of the four transistors, and a second control circuit provided corresponding to remaining two of the transistors. The first control circuit includes a first fuse and a first signal generating circuit. The first signal generating circuit outputs a low level first control signal to the gate of the corresponding transistor when a first fuse is disconnected, and outputs a high level first control signal to the gate of the corresponding transistor when the first fuse is connected. The second control circuit includes a second fuse and a second signal generating circuit. The second signal generating circuit outputs a high level second control signal to the gate of the corresponding transistor when the second fuse is disconnected, and outputs a low level second control signal to the gate of the corresponding transistor when the second fuse is connected.

5 Claims, 3 Drawing Sheets

SEMICONDUCTOR CIRCUIT DEVICE HAVING INTERNAL POWER SUPPLY CIRCUIT

TITLE OF THE INVENTION

Semiconductor Circuit Device Having Internal Power Supply Circuit

BACKGROUND OF THE INVENTION

1. Field of the Invention

The present invention relates to a semiconductor circuit device and, more specifically, to a semiconductor circuit device having an internal power supply circuit receiving an external power supply voltage and generating an internal power supply voltage lower than the external power supply voltage.

2. Description of the Background Art

Semiconductor memory devices such as DRAMs (Dynamic Random Access Memories) or SRAMs (Static Random Access Memories) have been proposed as one type of semiconductor circuit devices. Recently, in order to reduce power consumption, a semiconductor memory device including an internal power supply circuit for generating an internal power supply voltage (of 3.3V, for example) by down converting an external power supply voltage (of 5V, for example) has been available.

FIG. 5 is a schematic diagram showing a conventional internal power supply circuit used in a DRAM, for example. Referring to FIG. 5, the conventional internal power supply circuit includes a differential amplifier 60, an N channel MOS transistor 65, a driver transistor 66, P channel MOS transistors 67 to 69, fuses 71 to 73 and an N channel MOS transistor 74. Differential amplifier 60 includes P channel MOS transistors 61 and 62 as well as N channel MOS transistors 63 and 64, receives a reference voltage Vref at the gate of N channel MOS transistor 63 as an inversion input terminal, and supplies an output voltage to node h, using the gate of N channel MOS transistor 64 connected to a node k as a non-inversion input terminal. N channel MOS transistor 65 is connected at one side to N channel MOS transistors 63 and 64, and at the other side, connected to a ground node c, and is turned on/off in response to an enable signal TE. Driver transistor 66 receives at its gate an output voltage from differential amplifier 60, and is connected between an external power supply node a1 and an internal power supply node b. P channel MOS transistors 67 to 69 have gates connected to ground node c, and connected in series between internal power supply node b and node k. Fuse 71 is connected parallel to P channel MOS transistor 67, fuse 72 parallel to P channel MOS transistor 68, and fuse 73 parallel to P channel MOS transistor 69. Further, fuses 71 to 73 are connected in series between internal power supply node b and node k. N channel MOS transistor 74 is connected between node k and ground node c and receives at its gate a prescribed voltage Vcnt1.

In the above described internal power supply circuit, potential at node k is fed back to differential amplifier 60, whereby differential amplifier 60 controls driver transistor 66 such that the potential at node k is made equal to reference voltage Vref. As a result, the internal power supply circuit supplies an internal power supply voltage intVcc which is higher than the potential at node k by the voltage drop across internal power supply node b and node k, to internal power supply node b.

In the internal power supply circuit described above, reference voltage Vref is set in advance such that the internal power supply voltage intVcc supplied to internal power supply node b is lower than a desired value. Here, when at least one of fuses 71 to 73 is blown off, there is generated a voltage drop by channel resistance of P channel MOS transistors 67 to 69 connected parallel to the disconnected fuse, across internal power supply node b and node k, and by the amount corresponding to the voltage drop, internal power supply voltage intVcc increases.

In this manner, by adjusting number of fuses 71 to 73 to be blown off, the internal power supply voltage intVcc is increased to a desired value.

In the above described internal power supply circuit, it is possible to increase the internal power supply voltage intVcc by blowing off fuses 71 to 73, whereas it is impossible to decrease the internal power supply voltage. Therefore, when the internal power supply voltage intVcc is set higher than the desired value, it is impossible to adjust the internal power supply voltage intVcc to the desired value.

Further, when fuses 71 to 73 are formed of a material having high resistance such as polycrystalline silicon, potential difference between internal power supply node b and node k is increased because of the resistance of fuses 71 to 73, hindering adjustment of the internal power supply voltage intVcc to a desired value.

SUMMARY OF THE INVENTION

The present invention was made to solve the above described problem and its object is to provide a semiconductor circuit device in which the internal power supply voltage supplied by the internal power supply circuit can be adjusted by increasing or decreasing the internal power supply voltage to a desired value.

Another object of the present invention is to provide a semiconductor circuit device allowing adjustment of the internal power supply voltage supplied by the internal power supply circuit to a desired value, without any influence of fuse resistance.

According to the present invention, the semiconductor circuit device includes an internal power supply circuit connected to an external power supply node receiving an external power supply voltage, for generating an internal power supply voltage lower than the external power supply voltage at an internal power supply node. The internal power supply circuit includes a differential amplifier, a driver transistor, a plurality of resistance elements and a switch circuit. The differential amplifier has an inversion input terminal receiving a reference voltage. The driver transistor has its gate connected to an output terminal of the differential amplifier, and is connected between the external power supply node and the internal power supply node. The plurality of resistance elements are connected in parallel between the internal power supply node and a non-inversion input terminal of the differential amplifier, and each has a state of prescribed resistance and an insulated state. The switch circuit is connected to each of the plurality of resistance elements, and switches each of the plurality of resistance circuits between the prescribed resistance state and insulated state.

In the semiconductor circuit device, when each of the plurality of resistance elements is switched between the prescribed resistance state and the insulated state by the switch circuit, combined resistance between the internal power supply node and the non-inversion input terminal of the differential amplifier is increased/decreased. Accordingly, potential difference between the internal power supply node and the non-inversion input terminal of the differential amplifier increases/decreases. Further, the internal power supply voltage=(potential at non-inversion input terminal of the differential amplifier)+(potential difference between internal power supply node and non-inversion input terminal of the differential amplifier) also increases/decreases.

Accordingly, by switching each of the plurality of resistance elements between the prescribed resistance state and insulated state, it is possible to increase or decrease, and hence to adjust, the internal power supply voltage to a desired value.

Preferably, the plurality of resistance elements respectively include a plurality of transistors, and the switch circuit is connected to the gate of each of the plurality of transistors for turning on/off each of the plurality of transistors.

In the above described semiconductor circuit device, when the transistor is switched from off to on by the switch circuit, channel resistance of the transistor is added in parallel between the internal power supply node and the non-inversion input terminal of the differential amplifier, and hence combined resistance between the internal power supply node and the non-inversion input terminal of the differential amplifier is reduced, lowering the internal power supply voltage. When the transistor is switched from on to off by the switch circuit, channel resistance of the transistor is eliminated between the internal power supply node and the non-inversion input terminal of the differential amplifier. Therefore, combined resistance between the internal power supply node and the non-inversion input terminal of the differential amplifier increases, and hence internal power supply voltage increases.

Therefore, by switching the transistor on/off, it is possible to adjust the internal power supply voltage to a desired value.

Preferably, the switch circuit includes a first control circuit provided corresponding to at least one of the plurality of transistors, and a second control circuit provided corresponding to another of the plurality of transistors. The first control circuit includes a first fuse and a first signal generating circuit. The first signal generating circuit outputs a first control signal of a first logic level to the gate of the corresponding transistor when the first fuse is in a blown off or disconnected state, and outputs the first control signal at a second logic level to the gate of the corresponding transistor when the first fuse is in a not-blown off state or connected state. The second control circuit includes a second fuse and a second signal generating circuit. The second signal generating circuit outputs a second control signal at the second logic level to the gate of the corresponding transistor when the second fuse is in a connected state.

Therefore, it is possible to switch the transistor on/off by disconnecting the first or second fuse, and hence it is possible to increase or decrease the internal power supply voltage to adjust the voltage to the desired value.

Further, there is not any fuse provided between the internal power supply node and the non-inversion input terminal of the differential amplifier. Therefore, the internal power supply voltage can be adjusted without any influence of voltage drop caused by fuse resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
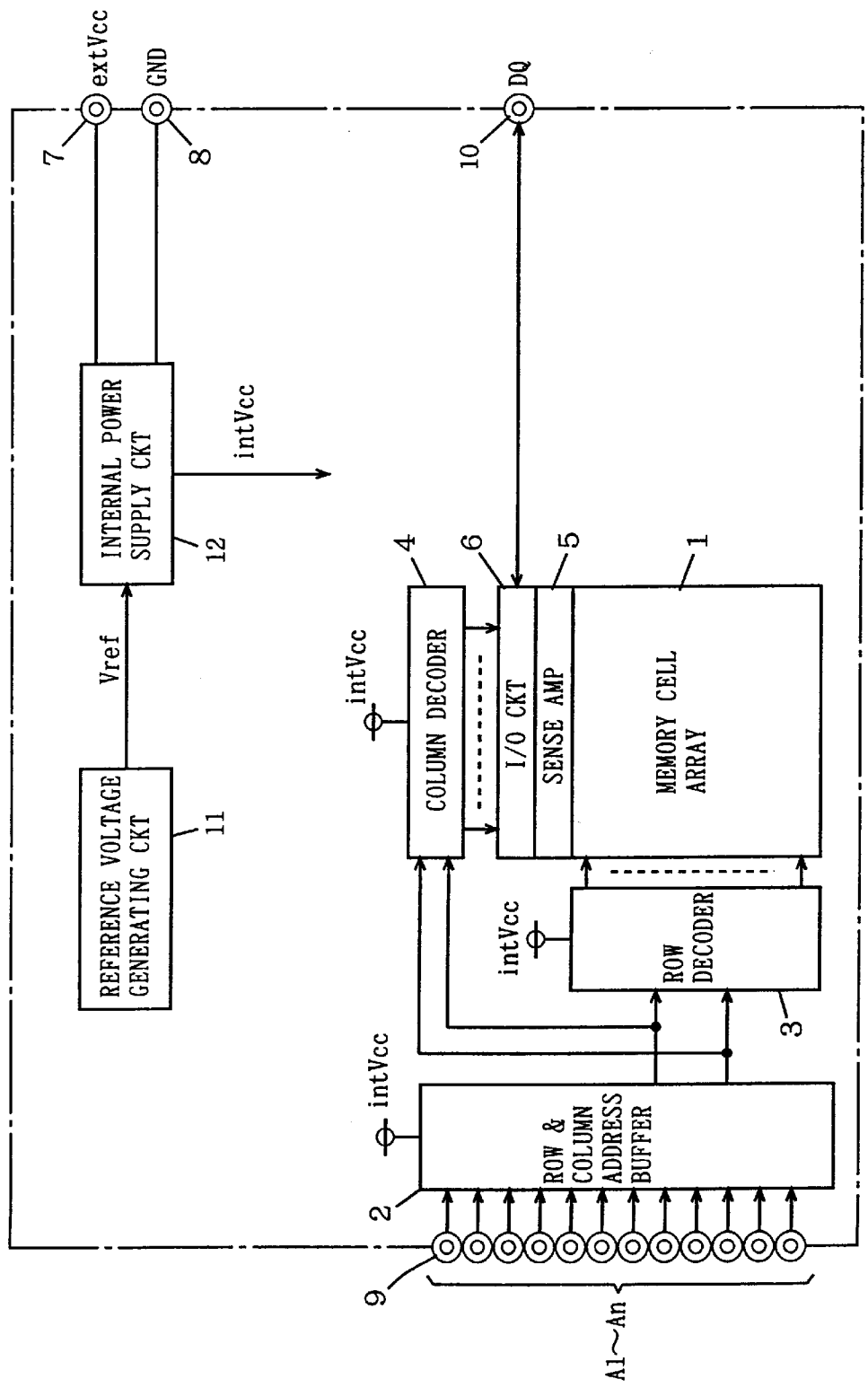
Referring to FIG. 1 is a block diagram showing an overall structure of a DRAM in accordance with a first embodiment of the present invention.

Embodiments of the present invention will be described in greater detail in the following, with reference to the figures. In the figures, corresponding portions are denoted by the same reference characters and description thereof is not repeated.

Referring to FIG. 1, the DRAM includes a memory cell array 1, a row and column address buffer 2, a row decoder 3, a column decoder 4, a sense amplifier 5 and an input/output circuit 6.

The DRAM further includes a power supply terminal 7 receiving an external power supply voltage ext.Vcc (of 5V, for example), a ground terminal 8 receiving a ground voltage GND, n address terminals 9 receiving row and column address signals Al to An, and a data input/output terminal 10 for inputting/outputting data signal DQ.

Memory cell array 1 includes a plurality of memory cells (not shown) arranged in rows and columns. Address buffer 2 converts row and column address signals Al to An from address terminals 9 to row address signals or column address signals. Row decoder 3 selects a row (word line) of memory cell array 1 in response to row address signals A1 to An from address buffer 2. Column decoder 4 selects a column (column selection line, bit line) of memory cell array 1 in response to column address signals A1 to An from address buffer 2. Sense amplifier 5 amplifies data signal read from memory cell array 1. Input/output circuit 6 includes a column selection gate and a data input/output line pair, for inputting data signal to a column selected by column decoder 4, and outputs data signal from a column selected by column decoder 4.

The DRAM further includes a reference voltage generating circuit 11 and an internal power supply circuit 12. Reference voltage generating circuit 11 generates a constant reference voltage Vref. Internal power supply circuit 12 down converts or lowers the external power supply voltage extVcc from power supply terminal 7 using reference voltage Vref as a reference, thus generates an internal power supply voltage intVcc (of 3.3V, for example), and supplies the generated internal power supply voltage to internal circuitry including address buffer 2, row decoder 3 and column decoder 4.

Figure 2:
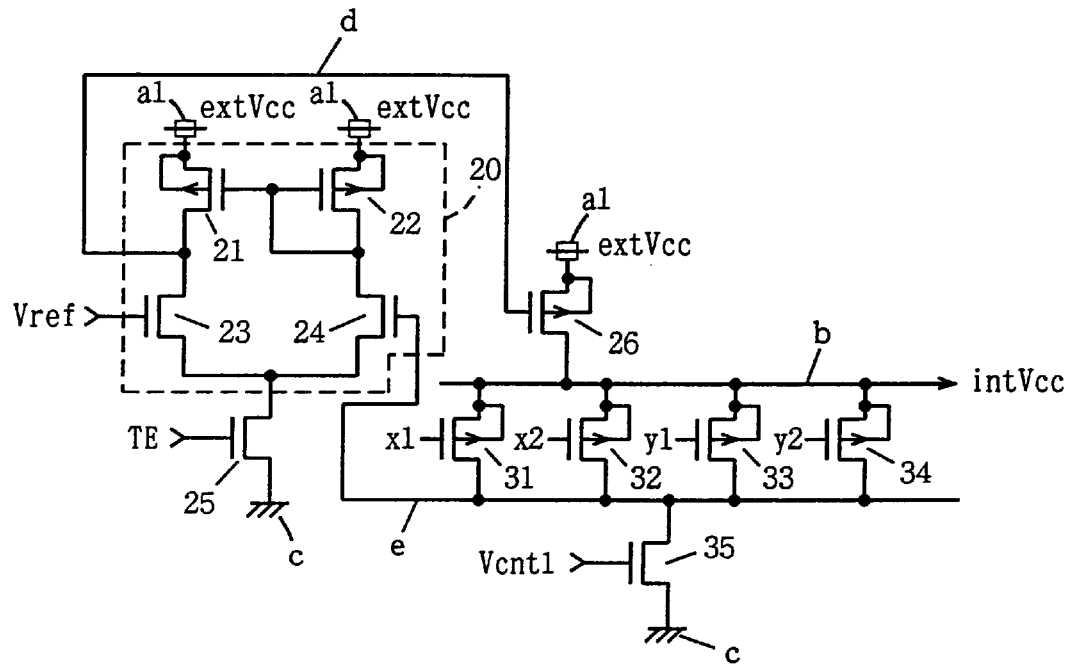
FIG. 2 is a circuit diagram showing a structure of the internal power supply circuit in the DRAM shown in FIG. 1.

Referring to FIG. 2, internal power supply circuit 12 includes a differential amplifier 20, N channel MOS transistor 25, driver transistor 26, P channel MOS transistors 31 to 34, and an N channel MOS transistor 35. Differential amplifier 20 includes P channel MOS transistors 21 and 22 as well as N channel MOS transistor 23 and 24, receives reference voltage Vref using the gate of N channel MOS transistor 23 as an inversion input terminal, and supplies an output voltage to node d, using the gate of N channel MOS transistor 24 connected to a node e as a non-inversion input terminal. N channel MOS transistor 25 has its drain connected to N channel MOS transistors 23 and 24 and its source connected to ground node c, and is turned on/off in response to an enable signal TE. Driver transistor 26 receives at its gate an output voltage from differential amplifier 20, and is connected between an external power supply node a1 and an internal power supply node b. P channel MOS transistors 31 to 34 are connected in parallel between internal power supply node b and a node e connected to the non-inversion input terminal of the differential amplifier. P channel MOS transistor 31 receives at its gate a control signal x1 from a control circuit X1 (described later) shown in FIG. 3, while P channel MOS transistor 32 receives at its gate a control signal x2 from a control circuit X2 (described later) shown in FIG. 3. P channel MOS transistor 33 receives at its gate a control signal y1 from a control circuit Y1 (described later) shown in FIG. 4, and P channel MOS transistor 34 receives at its gate a control signal y2 from a control circuit Y2 (described later) shown in FIG. 4. N channel MOS transistor 35 receives at its gate a prescribed voltage Vcnt1, and is connected between node e and ground node c.

Figure 3:
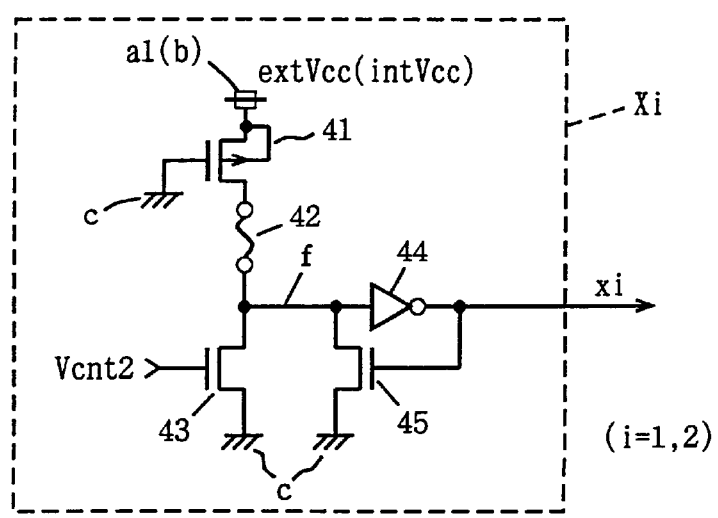
FIG. 3 is a circuit diagram showing a structure of a control circuit Xi (i=1, 2) for controlling the internal power supply circuit shown in FIG. 2.

Referring to FIG. 3, control circuit Xi includes a P channel MOS transistor 41, a fuse 42, an N channel MOS transistor 43, an inverter 44 and an N channel MOS transistor 45. P channel MOS transistor 41 is connected between external power supply node a1 and fuse 42, and has its gate connected to ground node c. Fuse 42 is connected between P channel MOS transistor 41 and N channel MOS transistor 43. N channel MOS transistor 43 is connected between fuse 42 and ground node c, and has its gate receiving constant voltage Vcnt2. Inverter 44 inverts a signal from an interconnection node f and outputs the resulting signal as control signal xi. N channel MOS transistor 45 is connected between interconnection node f and ground node c, and has its gate receiving an output signal from inverter 44. Inverter 44 and N channel MOS transistor 45 constitute a latch circuit.

Figure 4:
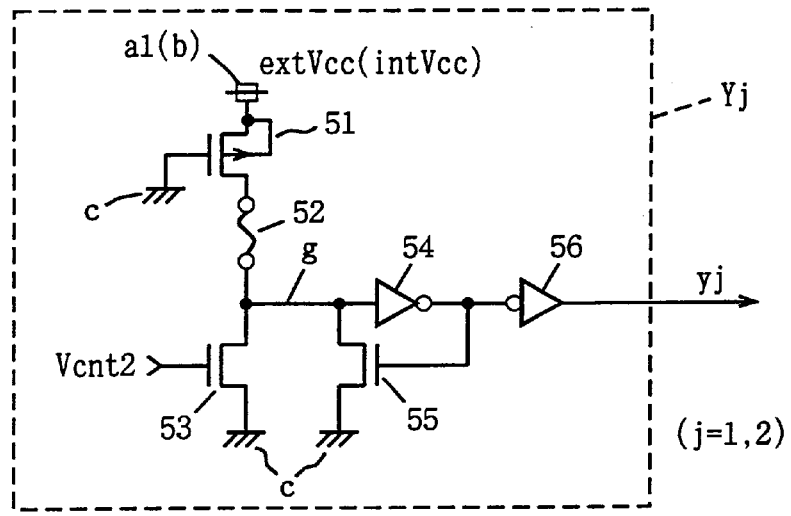
FIG. 4 is a circuit diagram showing a structure of a control circuit Yj (j=1, 2) for controlling the internal power supply circuit shown in FIG. 2.
Figure 5:
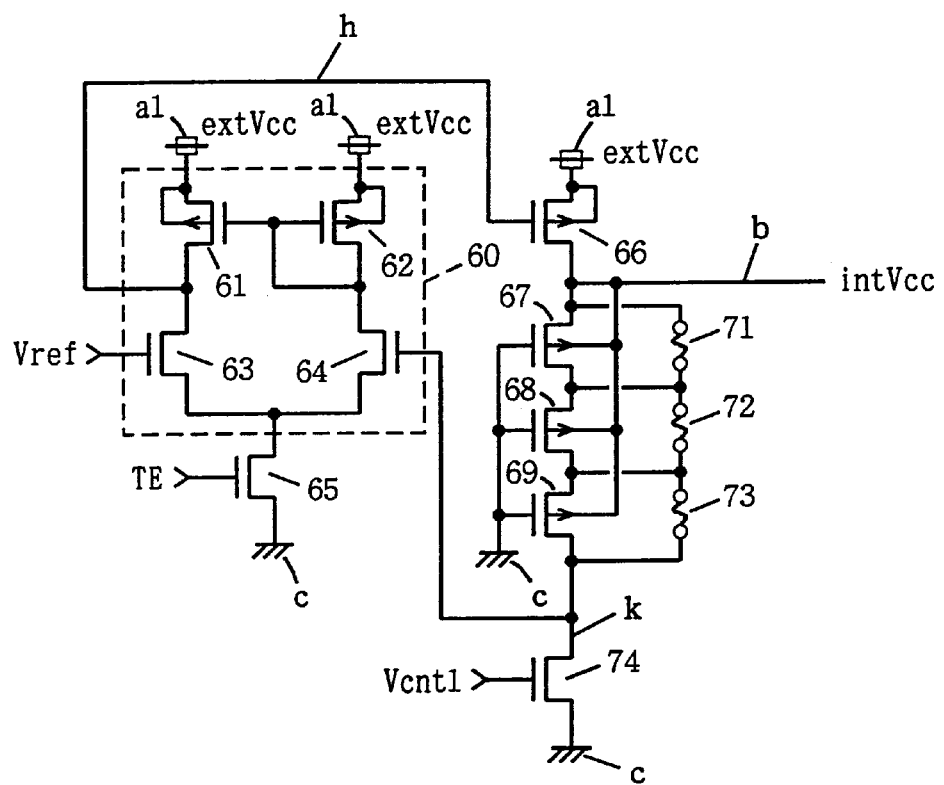
FIG. 5 is a schematic diagram showing a structure of a conventional internal power supply circuit.

Referring to FIG. 4, control circuit Yj includes a P channel MOS transistor 51, a fuse 52, an N channel MOS transistor 53, inverters 54 and 56, and an N channel MOS transistor 55. P channel MOS transistor 51 is connected between external power supply node a1 and fuse 52, and has its gate connected to ground node c. Fuse 52 is connected between P channel MOS transistor 51 and N channel MOS transistor 53. N channel MOS transistor 53 is connected between fuse 52 and ground node c, and receives at its gate a prescribed voltage Vcnt2. Inverter 54 inverts a signal from interconnection node g and outputs the inverted signal. N channel MOS transistor 55 is connected between interconnection node g and ground node c and has its gate receiving an output signal from inverter 54. Inverter 54 and N channel MOS transistor 55 constitute a latch circuit. Inverter 56 inverts an output signal from inverter 54 and outputs the resulting signal as control signal yj.

The operation of internal power supply circuit 12 of the DRAM having such a structure will be described in the following.

In the internal power supply circuit 12, when enable signal TE at the H (high) level is input to the gate of N channel MOS transistor 25, N channel MOS transistor 25 turns on, and as a result, differential amplifier 20 is activated. The potential at node e is fed back to differential amplifier 20, and differential amplifier 20 controls driver transistor 26 such that the potential at node e is made equal to the reference voltage Vref. As a result, the potential at node e is equalized to the reference voltage Vref. Therefore, the internal power supply voltage intVcc attains to (potential at node e+ potential difference between nodes b and e). Potential difference between nodes b and e is determined by combined resistance of channel resistances of P channel MOS transistors 31 to 34 connected in parallel. P channel MOS transistors 31 to 34 are turned on (prescribed resistance state) or off (insulated state) in response to control signals x1, x2, y1 and y2 input from control circuits X1, X2, Y1 and Y2 to the gates. Control signals xi and yj will be discussed. Referring to FIG. 3, P channel MOS transistor 41 has its gate connected to the ground node c, and hence P channel MOS transistor 41 is on. Since a voltage Vcnt2 which is lower than the power supply voltage Vcc is input to the gate of N channel MOS transistor 43, N channel MOS transistor 43 is not fully turned on but kept at a prescribed resistance state. Therefore, interconnection node f attains to the H level. The H level signal is inverted by inverter 44, and hence control signal xi attains to the L (low) level. More specifically, from control circuits X1 and X2 connected to the gates of P channel MOS transistors 31 and 32, L level signals x1 and x2 are output. As a result, P channel MOS transistors 31 and 32 are turned on (prescribed resistance state).

Referring to FIG. 4, control circuit Yj is similar in structure and function to control circuit Xi except inverter 56. Therefore, control signal yj at the h level is output from control circuit Yj. More specifically, H level signals y1 and y2 are output from control circuits Y1 and Y2 connected to the gates of P channel MOS transistors 33 and 34. As a result, P channel MOS transistors 33 and 34 are turned off (insulated state).

From the foregoing, it is understood that potential difference between nodes b and e corresponds to the voltage drop generated by the combined resistance of channel resistances of P channel MOS transistors 31 and 32.

Operation when fuse 42 of control circuit X1 is disconnected and when fuse 52 in control circuit Y1 is disconnected, will be described.

(a) When Fuse 42 of Control Circuit X1 is Disconnected

In this case, interconnection node f and P channel MOS transistor 41 shown in FIG. 3 are insulated, and hence charges at interconnection node f are drawn out to L level by N channel MOS transistor 43. Since the L level signal is inverted by inverter 44 and output, control signal x1 attains to the H level. Accordingly, P channel MOS transistor 31 makes a transition from on (prescribed resistance state) to off (insulated state). As a result, combined resistance between nodes b and e is only the channel resistance of P channel transistor 32. As compared with the state before disconnection of fuse 42, combined resistance between nodes b and e is increased, and as a result, potential difference between nodes b and e also increases. As a result, the internal power supply voltage intVcc increases.

(b) When Fuse 52 of Control Circuit Y1 is Disconnected

In this case also, as in (a) above, interconnection node g shown in FIG. 4 attains to the L level. However, the L level signal is output through inverters 54 and 56, and hence control signal y1 attains to the L level. Accordingly, P channel MOS transistor 33 makes a transition from off (insulated state) to on (prescribed resistance state). As a result, combined resistance between nodes b and e is combination of channel resistances of P channel MOS transistors 31, 32 and 33. As compared with the state before disconnection of fuse 52, combined resistance between nodes b and e is decreased, and hence potential difference between the nodes b and e is decreased. Accordingly, the internal power supply voltage intVcc lowers.

As described above, according to the present embodiment, control circuit Xi which outputs an L level signal when the fuse is connected and outputs an H level signal when the fuse is disconnected, as well as a control circuit Yj outputting an H level signal when the fuse is connected and outputs L level signal when the fuse is disconnected are provided corresponding to transistors 31 to 34 connected in parallel between internal power supply nodes b and e, whereby the internal power supply voltage intVcc is increased when fuse 42 of control circuit Xi is disconnected, and the internal power supply voltage intVcc lowers when fuse 52 of control circuit Yj is disconnected. Therefore, when the internal power supply voltage intVcc is lower than a desired value, a necessary number of fuses 42 of control circuit Xi should be disconnected, and when the internal power supply voltage intVcc is higher than the desired value, a necessary number of fuses 52 of control circuit Yj should be disconnected, thereby to adjust the internal power supply voltage intVcc to the desired value.

Further, since there is not any fuse provided between internal power supply node b and node e, the conventional problem of too large a potential difference between internal power supply node b and node e resulting from fuse resistance, hindering setting of the internal power supply voltage intVcc to the desired value, can be eliminated.

Though four transistors 31 to 34 are connected in parallel between internal power supply node b and node e and two control circuits Xi and two control circuits Yj are connected to the gates of the transistors, it is possible to adjust the range of increase/decrease of the internal power supply voltage intVcc by increasing/decreasing the number of transistors connected in parallel between internal power supply node b and node e.

Further, by connecting various transistors having different channel resistance values in parallel between internal power supply node b and node e, how much the internal power supply voltage intVcc is increased or decreased can be adjusted by disconnecting a fuse in one control circuit, whereby more delicate adjustment of the internal power supply voltage intVcc is possible.

Though one end of P channel MOS transistors 41 and 51 of control circuits Xi and Yj is connected to external power supply node a1, it may be connected to internal power supply node b.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device having an internal power supply circuit connected to an external power supply node receiving an external power supply voltage and generating an internal power supply voltage lower than said external power supply voltage at an internal power supply node, wherein said internal power supply circuit includes:

a differential amplifier having an inversion input terminal receiving a reference voltage;

a driver transistor having its gate connected to an output terminal of said differential amplifier and connected between said external power supply node and said internal power supply node;

a plurality of resistance elements connected in parallel between said internal power supply node and a non-inversion input terminal of said differential amplifier, each having a prescribed resistance state and an insulated state;

a voltage divide element connected between said non-inversion input terminal of said differential amplifier and a ground node; and switching means connected to each of said plurality of resistance elements and capable of switching said plurality of resistance elements from the prescribed resistance state to the insulated state and from the insulated state to the prescribed resistance state.

2. The semiconductor circuit device according to claim 1, wherein said plurality of resistance elements respectively include a plurality of transistors, and said switch means is connected to the gate of each of said plurality of transistors for turning on/off each of said plurality of transistors.

3. The semiconductor circuit device according to claim 2, wherein said switch means includes
first control means provided corresponding to at least one of said plurality of transistors, and
second control means provided corresponding to at least another one of said plurality of transistors, said first control means including
a first fuse, and
first signal generating means for outputting a first control signal of a first logic level when said first fuse is in a disconnected state, to the gate of the corresponding transistor, and outputting the first control signal of a second logic level when said first fuse is in a connected state, to the gate of the corresponding transistor, said second control means including
a second fuse, and
second signal generating means for outputting a second control signal of the second logic level when said second fuse is in a disconnected state, to the gate of the corresponding transistor, and outputting the second control signal of the first logic level when said second fuse is in the connected state, to the gate of the corresponding transistor.

4. The semiconductor circuit device according to claim 3, wherein said first signal generating means includes
a first resistance element connected in series with said first fuse between said external power supply node or said internal power supply node and a ground node, and
a first latch circuit for latching a signal from an interconnection node between said first fuse and said first resistance element, for outputting said first control signal; and said second signal generating means includes
a second resistance element connected in series with said second fuse between said external power supply node or said internal power supply node and the ground node,
a second latch circuit for latching a signal from an interconnection node between said second fuse and said second resistance element, and
an inverter for inverting an output signal from said second latch circuit to output said second control signal.

5. The semiconductor circuit device according to claim 4, wherein each of said first and second latch circuits includes
an inverter for inverting the signal from said interconnection node, and
a transistor connected between said interconnection node and said ground node and having its gate receiving an output signal from said inverter.

* * * * *